(12) United States Patent
Gehrke et al.

(10) Patent No.: US 6,486,042 B2
(45) Date of Patent: Nov. 26, 2002

(54) METHODS OF FORMING COMPOUND SEMICONDUCTOR LAYERS USING SPACED TRENCH ARRAYS AND SEMICONDUCTOR SUBSTRATES FORMED THEREBY

(75) Inventors: Thomas Gehrke, Carrboro, NC (US); Kevin J. Linthicum, Angier, NC (US); Robert F. Davis, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/906,258

(22) Filed: Jul. 16, 2001

(65) Prior Publication Data

US 2002/0013036 A1 Jan. 31, 2002

Related U.S. Application Data

(63) Continuation of application No. 09/512,242, filed on Feb. 24, 2000, now Pat. No. 6,261,929.

(51) Int. Cl.[7] .................. H01L 21/20; H01L 21/301
(52) U.S. Cl. .................. 438/462; 438/478; 438/483
(58) Field of Search .................. 438/462, 478, 438/479, 480–483, 460, 931; 257/76

(56) References Cited

U.S. PATENT DOCUMENTS

| | | | |
|---|---|---|---|
| 4,127,792 A | 11/1978 | Nakata | 313/500 |
| 4,522,661 A | 6/1985 | Morrison et al. | 148/33.2 |
| 4,651,407 A | 3/1987 | Bencuya | 29/571 |
| 4,865,685 A | 9/1989 | Palmour | 156/643 |

(List continued on next page.)

FOREIGN PATENT DOCUMENTS

| | | |
|---|---|---|
| CA | 2258080 | 10/1998 |
| EP | 0 551 721 A2 | 7/1993 |

(List continued on next page.)

OTHER PUBLICATIONS

Zeng et al., Optical properties of GaN pyramids, Applied Physics Letters, vol. 74, No. 9, Mar. 1, 1999, pp. 1227–1229.
International Search Report, PCT/US00/40724, Feb. 27, 2001.

(List continued on next page.)

*Primary Examiner*—Michael S. Lebentritt
(74) *Attorney, Agent, or Firm*—Moore & Van Allen, PLLC; Steven B. Phillips

(57) ABSTRACT

Methods of forming compound semiconductor layers include the steps of forming a plurality of selective growth regions at spaced locations on a first substrate and then forming a plurality of semiconductor layers at spaced locations on the first substrate by growing a respective semiconductor layer on each of the selective growth regions. The first substrate is then divided into a plurality of second smaller substrates that contain only a respective one of the plurality of semiconductor layers. This dividing step is preferably performed by partitioning (e.g., dicing) the first substrate at the spaces between the selective growth regions. The step of forming a plurality of semiconductor layers preferably comprises growing a respective compound semiconductor layer (e.g., gallium nitride layer) on each of the selective growth regions. The growing step may comprise pendeoepitaxially growing a respective gallium nitride layer on each of the selective growth regions. Each of the selective growth regions is also preferably formed as a respective plurality of trenches that have sidewalls which expose compound semiconductor seeds from which epitaxial growth can take place.

3 Claims, 5 Drawing Sheets

U.S. PATENT DOCUMENTS

| | | | |
|---|---|---|---|
| 4,876,210 A | 10/1989 | Barnett et al. | 437/5 |
| 4,912,064 A | 3/1990 | Kong et al. | 437/100 |
| 4,946,547 A | 8/1990 | Palmour et al. | 156/643 |
| 5,122,845 A | 6/1992 | Manabe et al. | 357/17 |
| RE34,861 E | 2/1995 | Davis et al. | 437/100 |
| 5,389,571 A | 2/1995 | Takeuchi et al. | 437/133 |
| 5,397,736 A | 3/1995 | Bauser et al. | 437/92 |
| 5,549,747 A | 8/1996 | Bozler et al. | 117/43 |
| 5,710,057 A | 1/1998 | Kenney | 437/62 |
| 5,760,426 A | 6/1998 | Marx et al. | 257/190 |
| 5,786,606 A | 7/1998 | Nishio et al. | 257/103 |
| 5,815,520 A | 9/1998 | Furushima | 372/45 |
| 5,877,070 A | 3/1999 | Goesele et al. | 438/458 |
| 5,880,485 A | 3/1999 | Marx et al. | 257/94 |
| 5,915,194 A | 6/1999 | Powell et al. | 438/478 |
| 6,051,849 A | 4/2000 | Davis et al. | 257/103 |
| 6,121,121 A | 9/2000 | Koide | 438/481 |
| 6,153,010 A | 11/2000 | Kiyoku et al. | 117/95 |
| 6,261,929 B1 * | 7/2001 | Gehrke et al. | 438/462 |

FOREIGN PATENT DOCUMENTS

| | | |
|---|---|---|
| EP | 0 852 416 A1 | 7/1998 |
| EP | 0 884 767 A2 | 12/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |
| WO | WO 99/18617 | 4/1999 |
| WO | WO 99/44224 | 9/1999 |

OTHER PUBLICATIONS

International Search Report, PCT/US99/27358, Apr. 28, 2000.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50° C With a Fundamental Transverse Mode, Jpn. J. Appl. Phys. vol. 38, Part 1, No. 3A, Mar. 1, 1999, pp. L226–L229.

Boo et al., Growth of Hexagonal GaN Thin Films on Si(111) with Cubic SiC Buffer Layers, Journal of Crystal Growth 189–190, 1998, pp. 183–188.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Steckl et al., SiC Rapid Thermal Corbonization of the (111)Si Semiconductor–on–Insulator Structure and Subsequent Metalorganic Chemical Vapor Deposition, Appl. Phys. Let., 69 (15), Oct. 7, 1996, pp. 2264–2266.

International Search Report, PCT/US99/28056, Apr. 26, 2000.

International Search Report, PCT/US99/04346, Jun. 9, 1999.

Gallium Nitride–2000–Technology, Status, Applications, and Market Forecasts, Strategies Unlimited, Report SC–23, May 2000.

Chen et al., Dislocation Reducing in GaN Thin Films Via Lateral Overgrowth From Trenches, Applied Physics Letters, vol. 75, No. 14, Oct. 4, 1999, pp. 2062–2063.

Nakamura, InGaN/GaN/AlGaN–Based Laser Diodes, Properties, Processing and Applications of Gallium Nitride and Related Semiconductors, EMIS Datareviews Series No. 23, 1998, pp. 587–595.

Hiramatsu et al., Selective Area Growth and Epitaxial Lateral Overgrowth of GaN, Properties, Processing and Applications of Gallium Nitride and Related Semiconductors, EMIS Datareviews Series No. 23, 1998, pp. 440–446.

Sakai, Defect Structure in Selectively Grown GaN Films With Low Threading Dislocation Density, Appl. Phys. Lett., vol. 71, No. 16, Oct. 20, 1997, pp. 2259–2261.

Gustafsson et al., Investigations of High Quality $Ge_xSi_{l-x}$ Grown by Heteroepitaxial Lateral Overgrowth Using Cathoduluminescence, Inst. Phys. Conf. Ser. No. 134: Section 11, Micros. Semicond. Mater. Conf., Oxford, Apr. 5–8, 1993, pp. 675–678.

Givargizov, Other Approaches to Oriented Crystallization on Amorphous Substrates, Chapter 4, Oriented Crystallization on Amorphous Substrates, Plenum Press, 1991, pp. 221–264.

Akasaki et al., Effects of AlN Buffer Layer on Crystallographic Structure and on Electrical and Optical Properties of GaN and $Ga_{l-x}Al_xN$ ($0<\chi\leq0.4$) Films Grown on Sapphire Substrate by MOVPE, Journal of Crystal Growth, vol. 98, 1989, pp. 209–219.

Ujiie et al., Epitaxial Lateral Overgrowth of GaAs on a Si Substrate, Jpn. J. Appl. Phys., vol. 28, 1989, p. L337–L339.

Ishiwara et al., Lateral Solid Phase Epitaxy of Amorphous Si Films on Si Substrates With $SiO_2$ Patterns, Applied Physics Letters, vol. 43, No. 11, Dec. 1, 1983, pp. 1028–1030.

Jastrzebski, SOI by CVD: Epitaxial Lateral Overgrowth (ELO) Process–Review, Journal of Crystal Growth, vol. 63, 1983, pp. 493–526.

Rathman et al., Lateral Epitaxial Overgrowth of Silicon on $SiO_2$, Journal of the Electrochemical Society, Oct. 1982, pp. 2303–2306.

Shaw, Selective Epitaxial Deposition of Gallium Arsenide in Holes, Journal of the Electrochemical Society, Sep. 1966, pp. 904–908.

Tausch, Jr. et al., A Novel Crystal Growth Phenomenon: Single Crystal GaAs Overgrowth Onto Silicon Dioxide, Journal of the Electrochemical Society, Jul. 1965, pp. 706–709.

Joyce et al., Selective Epitaxial Deposition of Silicon, Nature, vol. 4840, Aug. 4, 1962, pp. 485–486.

LEO Unmasked By Pendeo–Epitaxy, Nitride News, Compound Semiconductor, Mar. 1999, p. 16.

Honda et al., Selective Area Growth of GaN Microstructures on Patterned (111) and (001) Si Substrates, 4th European Workshop on GaN, Nottingham, UK, Jul. 2–5, 2000.

Gehrke et al., Pendeo–Epitaxial Growth of Gallium Nitride on Silicon Substrates, Journal of Electronic Materials, vol. 29, No. 3, Mar. 2000, pp. 306–310.

Gehrke et al., Pendeo–Epitaxy of Gallium Nitride and Aluminum Nitride Films and Heterostructures on Silicon Carbide Substrate, MRS Internet J. Semicond. Res. 4S1, G3.2, 1999, 6 pp.

Thomson et al., Ranges of Deposition Temperatures Applicable for Metalorganic Vapor Phase Epitaxy of GaN Films Via the Technique of Pendeo–Epitaxy, MRS Internet J. Semicond. Res. 4S1, G3.37, 1999, 6 pp.

U.S. patent application Ser. No. 60/088,761, Linthicum et al., filed Jun. 10, 1998.

U.S. patent application Ser. No. 09/525,721, Davis et al., filed Mar. 14, 2000.

U.S. patent application Ser. No. 09/441,753, Gehrke et al., filed Nov. 17, 1999.

International Search Report, PCT/US99/12967, Oct. 18, 1999.

Linthicum et al., Pendeoepitaxy of Gallium Nitride Thin Films, Applied Physics Letters, vol. 75, No. 2, Jul. 12, 1999, pp. 196–19.

Zheleva et al., Pendeo–Epitaxy: A New Approach for Lateral Growth of Gallium Nitride Films, Journal of Electronic Materials, vol. 28, No. 4, Feb. 1999, pp. L5–L8.

Zheleva et al., Pendeo–Epitaxy—A New Approach for Lateral Growth of GaN Structures, MRS Internet Journal of Nitride Semiconductor Research, 1999, Online!, vol. 4S1, No. G3.38, Nov. 30, 1998–Dec. 4, 1998.

Nakamura et al., InGaN/GaN/AlGaN–Based Laser Diodes Growth on GaN Substrates With a Fundamental Transverse Mode, Jpn. J. Appl. Phys., vol. 37, Sep. 15, 1998, pp. L1020–L1022.

Marchand et al., Microstructure of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nam et al., Lateral Epitaxial Overgrowth of GaN Films on $SiO_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Area Si Wafers by APCVD–Temperature Dependence, Materials Science Forum, vols. 264–268, 1998, pp. 179–182.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction Via Lateral Epitaxy in Selectively Grown GaN Structures, Appl. Phys. Lett., vol. 71, No. 17, Oct. 27, 1997, pp. 2472–2474.

Nam, et al., "Growth of GaN and $Al_{0.2}Ga_{0.8}N$ on Patterned Substrates Via Organometallic Vapor Phase Epitaxy", Jpn. J. Appl. Phys., vol. 36, Part 2, No. 5A, May 1, 1997, pp. 532–535.

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Kapolnek et al., "Selective Area Epitaxy of GaN for Electron Field Emission Devices", Journal of Crystal Growth, 5451, 1996, pp. 1–4.

Weeks et al, "GaN Thin Films Deposited Via Organometallic Vapor Phase Epitaxy on $\alpha(6H)$–SiC(0001) Using High–Temperature Monocrystalline AlN Buffer Layers", Appl. Phys. Lett. 67 (3), Jul. 17, 1995, pp. 401–403.

Doverspike et al., The Effect of GaN and AlN Buffer Layers on GaN Film Properties Grown on Broth C–Plane and A–Plane Sapphire, Journal of Electronic Materials, vol. 24, No. 4, 1995, pp. 269–273.

Kato et al., "Selective Growth of Wurtzite GaN and $Al_xGa_{1-x}N$ on GaN/Sapphire Substrates by Metalorganic Vapor Phase Epitaxy", Journal of Crystal Growth, 144, 1994, pp. 133–140.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Watanabe et al., The Growth of Single Crystalline GaN on a Si Substrate Using AlN As An Intermediate Layer, Journal of Crystal Growth, vol. 128, 1993, pp. 391–396.

Yamaguchi et al, "Lateral Supply Mechanisms in Selective Metalorganic Chemical Vapor Deposition", Jpn. Appl. Phys., vol. 32 (1993), pp. 1523–1527.

Nakamura, GaN Growth Using GaN Buffer Layer, Japanese Journal of Applied Physics, vol. 30, No. 10A, Oct. 1991, pp. L1705–L1707.

Chen et al., Silicon–on–Insulator: Why, How, and When, AIP Conference Proceedings, vol. 167, No. 1, Sep. 15, 1988, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Yoshida et al., Improvements on the Electrical and Luminescent Properties of Reactive Molecular Beam Epitaxially Grown GaN Films by Using AlN–Coated Sapphire Substrates, Applied Physics Letters, vol. 42, No. 5, Mar. 1, 1983, pp. 427–429.

* cited by examiner

METHODS OF FORMING COMPOUND SEMICONDUCTOR LAYERS USING SPACED TRENCH ARRAYS AND SEMICONDUCTOR SUBSTRATES FORMED THEREBY

CROSS REFERENCE TO RELATED APPLICATION

This application is a continuation application of, and claims priority from, U.S. Pat. Application No. 09/512,242, filed Feb. 24, 2000 now U.S. Pat. No. 6,261,929 the entire disclosure of which in incorporated herein by reference.

FEDERALLY SPONSORED RESEARCH

This invention was made with Government support under Office of Naval Research Contract No. N00014-98-1-0384. The Government may have certain rights to this invention.

FIELD OF THE INVENTION

The present invention relates to methods of forming semiconductor substrates and substrates formed thereby, and more particularly to methods of forming compound semiconductor substrates and compound semiconductor substrates formed thereby.

BACKGROUND OF THE INVENTION

Compound semiconductor materials such as gallium nitride (GaN) have been widely investigated as suitable substrate materials for microelectronic devices including but not limited to transistors, field emitters and optoelectronic devices. It will be understood that, as used herein, compound semiconductor materials may include III–V and II–VI alloys, for example. Reference to specific compound semiconductors such as gallium nitride will also be understood to include a family of gallium nitride alloys such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is lattice mismatch with the substrate on which the gallium nitride layer is grown. Thus, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable. It also is known to produce low defect density gallium nitride layers by forming a mask on a layer of gallium nitride, the mask including at least one opening that exposes the underlying layer of gallium nitride, and laterally growing the underlying layer of gallium nitride through the at least one opening and onto the mask. This technique often is referred to as "Epitaxial Lateral Overgrowth" (ELO). The layer of gallium nitride may be laterally grown until the gallium nitride coalesces on the mask to form a single layer on the mask. In order to form a continuous layer of gallium nitride with relatively low defect density, a second mask may be formed on the laterally overgrown gallium nitride layer, that includes at least one opening that is offset from the underlying mask. ELO then again is performed through the openings in the second mask to thereby overgrow a second low defect density continuous gallium nitride layer. Microelectronic devices then may be formed in this second overgrown layer. ELO of gallium nitride is described, for example, in the publications entitled Lateral Epitaxy of Low Defect Density GaN Layers Via Organometallic Vapor Phase Epitaxy to Nam et al., Appl. Phys. Lett. Vol. 71, No. 18, Nov. 3, 1997, pp. 2638–2640; and Dislocation Density Reduction Via Lateral Epitaxy in Selectively Grown GaN Structures to Zheleva et al, Appl. Phys. Lett., Vol. 71, No. 17, Oct. 7, 1997, pp. 2472–2474, the disclosures of which are hereby incorporated herein by reference.

It also is known to produce a layer of gallium nitride with low defect density by forming at least one trench or post in an underlying layer of gallium nitride to define at least one sidewall therein. A layer of gallium nitride is then laterally grown from the at least one sidewall which acts as a "seed". Lateral growth preferably takes place until the laterally grown layers coalesce within the trenches. Lateral growth also preferably continues until the gallium nitride layer that is grown from the sidewalls laterally overgrows onto the tops of the posts. In order to facilitate lateral growth and produce nucleation of gallium nitride and growth in the vertical direction, the top of the posts and/or the trench floors may be masked.

Lateral growth from the sidewalls of trenches and/or posts also is referred to as "pendeoepitaxy" and is described, for example, in publications by Zheleva et al, entitled "Pendeo-Epitaxy: A New Approach for Lateral Growth of Gallium Nitride Films", Journal of Electronic Materials, Vol. 28, No. 4, pp. L5-L8, February (1999) and Linthicum et al, entitled "Pendeoepitaxy of Gallium Nitride Thin Films" Applied Physics Letters, Vol. 75, No. 2, pp. 196–198, Jul. (1999), the disclosures of which are hereby incorporated herein by reference. Pendeoepitaxy has also been shown to be successful at reducing threading dislocations and cracks caused by lattice mismatch by about three to four orders of magnitude relative to other conventional heteroepitaxy techniques. Nonetheless, because pendeoepitaxy may not always be successful in preventing the formation of cracks and bowing when large compound semiconductor layers such as gallium nitride are cooled to room temperature during back-end processing steps, there continues to be a need for improved methods of forming compound semiconductor layers with reduced susceptibility to cracking and bowing.

SUMMARY OF THE INVENTION

It is therefore an object of the present invention to provide improved methods of forming compound semiconductor substrates and substrates formed thereby.

It is another object of the present invention to provide methods of forming compound semiconductor substrates that can be less susceptible to cracking and bowing during back-end processing steps.

These and other objects, advantages and features of the present invention may be provided by methods of forming semiconductor substrates which include the steps of forming a plurality of selective growth regions at spaced locations on a first substrate and then forming a plurality of semiconductor layers at spaced locations on the first substrate by growing a respective semiconductor layer on each of the selective growth regions. The first substrate is then divided into a plurality of second smaller substrates that contain only a respective one of the plurality of semiconductor layers. This dividing step is preferably performed by partitioning (e.g., dicing) the first substrate at the spaces between the selective growth regions. Because this step of dividing the first substrate need not take place until all microelectronic processing steps have taken place, the first substrate with the selective growth regions may be processed on a wafer scale, as with conventional semiconductor wafers.

According to one preferred embodiment of the present invention, the step of forming a plurality of semiconductor layers preferably comprises growing a respective compound semiconductor layer (e.g., gallium nitride layer) on each of the selective growth regions. In particular, the growing step may comprise pendeoepitaxially growing a respective gallium nitride layer on each of the selective growth regions. Each of the selective growth regions is also preferably formed as a respective plurality of trenches that have sidewalls which expose compound semiconductor seeds from which epitaxial growth can take place. In particular, the step of forming a plurality of semiconductor layers may comprises epitaxially growing a first continuous semiconductor layer from sidewalls of a first plurality of trenches (within a first selective growth region) and epitaxially growing a second continuous semiconductor layer from sidewalls of a second plurality of trenches (within a second selective growth region). According to a preferred aspect of this embodiment of the present invention, when the growth steps are completed, the first continuous semiconductor layer and the second continuous semiconductor layer will have opposing edges that are spaced from each other by a wide trench that extends between adjacent edges of the first selective growth region and the second selective growth region.

Advantageously, because each selective growth region is separated from a next adjacent selective growth region by a wide trench the preferably has a width at least about ten (10) times greater than the widths of the narrower trenches within a respective selective growth region, adjacent monocrystalline compound semiconductor layers preferably do not coalesce with each other. Nonetheless, because each monocrystalline compound semiconductor layer is of sufficiently large dimension to ultimately serve as a separate compound semiconductor substrate or "platform" once the supporting substrate has been diced along the dicing streets defined by each wide trench, the failure of the adjacent compound semiconductor layers to coalesce into a single wafer-sized layer need not limit the suitability of the preferred methods for large scale integrated circuit and optoelectronic applications. Instead, by preventing adjacent compound semiconductor layers from coalescing with each other, the likelihood that the compound semiconductor layers will bow or crack upon cooling, as a result of lattice mismatch and thermal expansion coefficient differences, is substantially reduced. In other words, by growing separate compound semiconductor "platforms" separated by wide trenches, the lattice stress and concomitant build-up in strain within each "platform", caused by differences in the thermal expansion coefficients of the compound semiconductor material and underlying substrate is greatly reduced relative to a large fully coalesced pendeoepitaxially formed compound semiconductor layer.

DESCRIPTION OF PREFERRED EMBODIMENTS

Figure 1:
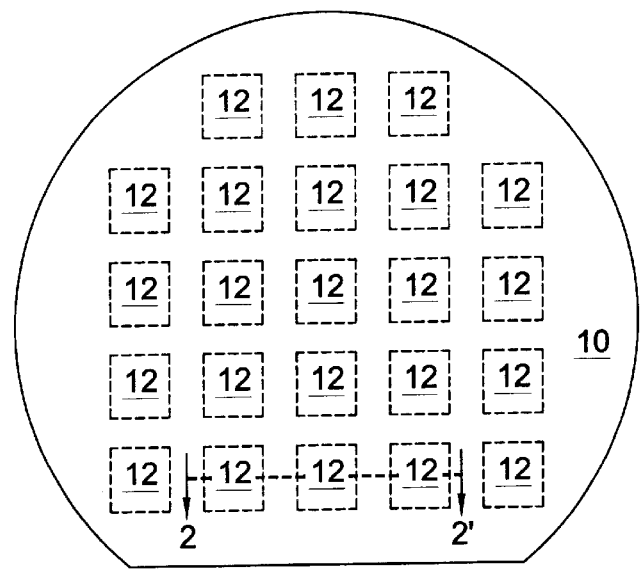
FIG. 1 is a plan layout view of a semiconductor wafer having a plurality of selective growth regions at spaced locations therein, according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
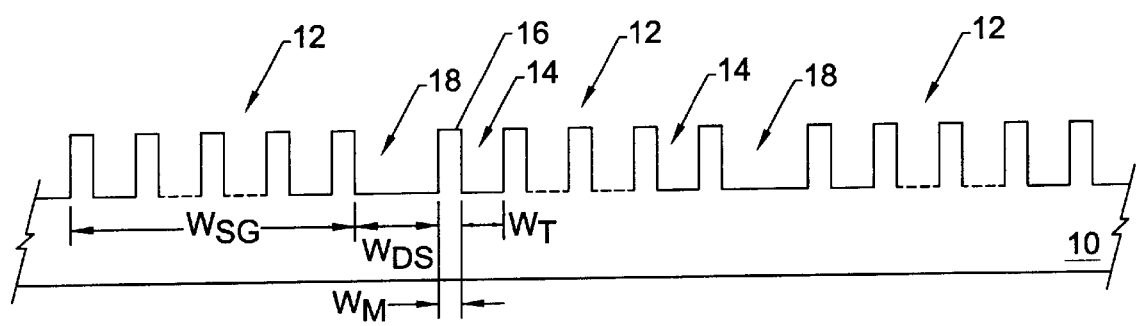
FIG. 2 is a cross-sectional view of the wafer of FIG. 1 at a first intermediate stage of processing, taken along line 2–2'.

Referring now to FIGS. 1–4, preferred methods of forming a plurality of compound semiconductor substrates will be described. In particular, FIGS. 1–2 illustrate preferred steps of forming a plurality of selective growth regions 12 at spaced locations across a composite semiconductor substrate 10. These selective growth regions 12 may be rectangular in shape and have an area greater than about $1\times10^4$ $\mu m^2$. According to one aspect of the present invention, the substrate 10 may comprise a (111) silicon wafer having a plurality of semiconductor layers stacked thereon. In particular, the plurality of semiconductor layers may include an underlying silicon carbide (SiC) layer, an intermediate aluminum nitride (AlN) layer on the silicon carbide layer and a gallium nitride (GaN) 45 seed layer on the intermediate aluminum nitride layer, as described more fully hereinbelow with respect to FIGS. 5A–5J. Alternative exemplary substrates are also described in U.S. Application Ser. No. 09/441,754, entitled "Methods of Fabricating Gallium Nitride Microelectronic Layers on Silicon Layers and Gallium Nitride Microelectronic Structures Formed Thereby", filed Nov. 17, 1999, now U.S. Pat. No. 2,255,198 the disclosure of which is hereby incorporated herein by reference. Other substrates including those containing sapphire and/or compound semiconductor seed layers besides gallium nitride may also be used.

Referring now to FIG. 2, each of the selective growth regions 12 is preferably formed by selectively etching the substrate 10 to define a plurality of narrow parallel stripe-shaped trenches 14 and a plurality of parallel stripe-shaped semiconductor mesas 16 extending between the narrow trenches 14. The depths of these trenches 14 are preferably selected so that the sidewalls thereof expose portions of an underlying compound semiconductor seed layer. As illustrated, the semiconductor mesas 16 may be formed to have a uniform width "$W_m$" and the narrow trenches 14 may formed to have a uniform width "$W_t$". These widths may also be nonuniform. Typical values of $W_m$ and $W_t$ may be about 1.0 $\mu$m and 4.0 $\mu$m, respectively. Each of the selective growth regions 12 may also have a width "$W_{sg}$" and may be spaced from a next adjacent selective growth region 12 by a respective wide trench 18 having a width "$W_{ds}$". Typical values for $W_{sg}$ and WdS may be 500 $\mu$m and 50 $\mu$m, respectively. The value of $W_{ds}$ is also preferably set at a level greater than about ten (10) times $W_t$. As will be understood by those skilled in the art, the narrow trenches 14 and wide trenches 18 may be formed simultaneously by anisotropically etching the substrate 10 using a photolithographically patterned mask having openings therein where the trenches are to be formed. Typical etching techniques include reactive ion etching (RIE) and inductively coupled plasma (ICP). Selective growth techniques may also be used to define the mesas 16.

Figure 3:
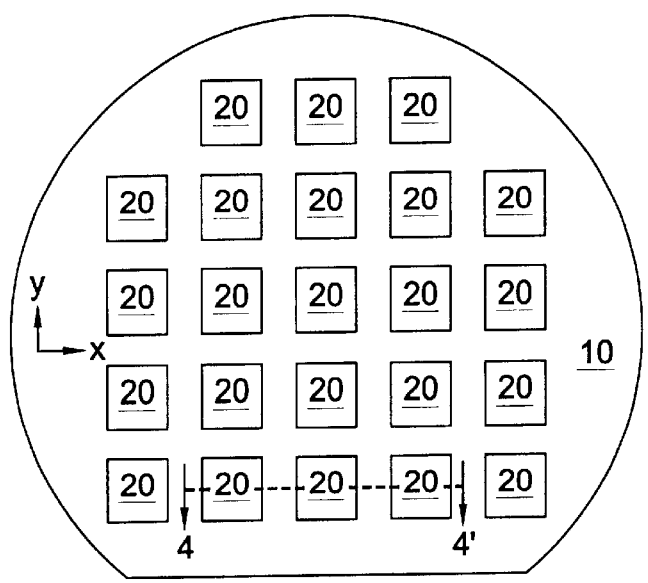
FIG. 3 is a plan layout view of a semiconductor wafer having a plurality of compound semiconductor layers thereon, according to an embodiment of the present invention.
Figure 4:
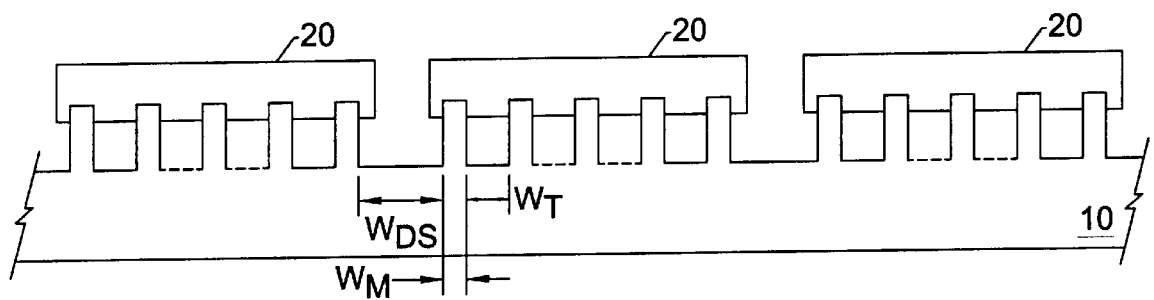
FIG. 4 is a cross-sectional view of the wafer of FIG. 3 at a second intermediate stage of processing, taken along line 4–4'.

Referring now specifically to FIGS. 3–4, pendeoepitaxial growth techniques are preferably used to form a separate monocrystalline compound semiconductor layer 20 on each of the selective growth regions 12. In particular, pendeoepitaxial growth techniques may be used to grow a respective monocrystalline gallium nitride layer from gallium nitride "seeds" that are exposed by the sidewalls of the mesas 16 within each selective growth region 12. Exemplary pendeoepitaxial growth techniques are more fully described in U.S. application Ser. No. 09/198,784, entitled "Pendeoepitaxial Methods of Fabricating Gallium Nitride Semiconductor Layers on Silicon Carbide Substrates by Lateral Growth from Sidewalls of Masked Posts, and Gallium Nitride Semiconductor Structures Fabricated Thereby, filed Nov. 24, 1998 now U.S. Pat. No. 6,177,688, and in U.S. application Ser. No. 09/468,995, entitled "Pendeoepitaxial Methods of Fabricating Gallium Nitride Semiconductor Layers on Weak Posts, and Gallium Nitride Semiconductor Structures Fabricated Thereby, filed Dec. 21, 1999, now U.S. Pat. No. 6,380,108, the disclosures of which are hereby incorporated herein by reference.

Advantageously, because each selective growth region 12 is separated from a next adjacent selective growth region 12 by a wide trench that preferably has a width at least about ten (10) times greater than the widths of the narrow trenches within a respective selective growth region 12, adjacent monocrystalline compound semiconductor layers 20 preferably do not coalesce with each other. However, because each monocrystalline compound semiconductor layer 20 is of sufficiently large dimension to ultimately serve as a separate compound semiconductor substrate or "platform" once the supporting substrate 10 has been diced along the dicing streets defined by each wide trench 18, the failure of the adjacent compound semiconductor layers 20 to coalesce into a single wafer-sized layer need not limit the suitability of the preferred methods for large scale integrated circuit and optoelectronic applications. Instead, by preventing adjacent compound semiconductors 20 from coalescing wish each other, the likelihood that the compound semiconductor layers 20 will bow or crack upon cooling, as a result of lattice mismatch and thermal expansion coefficient differences, is substantially reduced. In other words, by growing separate compound semiconductor "platforms" separated by wide trenches, the lattice stress and concomitant build-up in strain within each "platform" caused by differences in the thermal expansion coefficients of the compound semiconductor material and underlying substrate is greatly reduced relative to a large fully coalesced pendeoepitaxially formed compound semiconductor layer.

Referring again to FIG. 3, conventional techniques can then be used to dice the substrate 10 into a plurality of separate compound semiconductor substrates. Here, the wide trenches that extend between the grid of adjacent selective growth regions can be treated as dicing streets for aligning the directional sawing of the substrate 10 in the x and y directions. The width of the wide trenches is preferably selected so that the substrate 10 can be sawed without damaging the compound semiconductor layers 20. According to another aspect of the present invention, the arrangement of each of the compound semiconductor layers may be designed to preserve usable active regions within the underlying substrate 10. For example, the arrangement of compound semiconductor layers 20 may be designed so that after dicing each separate substrate (e.g., semiconductor chip) includes one or more compound semiconductor layers 20 thereon and one or more active regions therein in which semiconductor devices can be formed. Thus, if each compound semiconductor layer 20 comprised gallium nitride and the original substrate 10 comprised a silicon carbide layer, both gallium nitride and silicon carbide devices could be integrated within a single semiconductor chip.

Figure 5A:
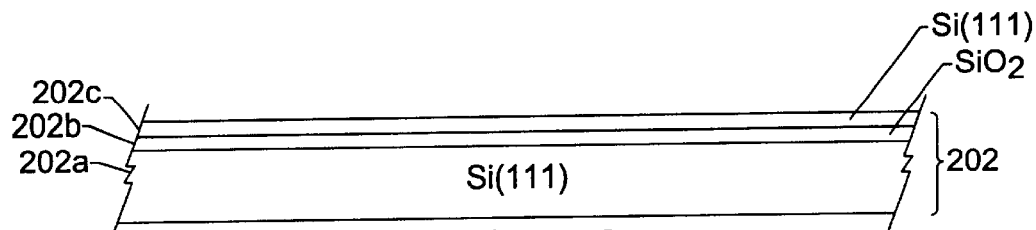
FIGS. 5A–5J are cross-sectional views of intermediate structures that illustrate a method of forming a single semiconductor layer of FIG. 4 using a pendeoepitaxial growth technique.

Referring now to FIGS. 5A–5J, an exemplary method of forming a respective gallium nitride semiconductor layer on a central portion of a selective growth region 12 will be described. According to this exemplary method, a (111) silicon SIMOX supporting substrate 202 is provided. As illustrated by FIG. 5A, this substrate 202 includes a buried layer of silicon dioxide 202b therein that defines a (111) silicon surface layer 202c on an underlying (111) silicon substrate 202a. The buried layer of silicon dioxide may be fabricated by implanting oxygen into a (111) silicon substrate to define a (111) silicon surface layer on the (111) silicon substrate. This process generally is referred, to as SIMOX and is described for example in an article by Chen, entitled "Silicon-on-Insulator: Why, How, and When", AIP Conference Proceedings, Vol. 167, No. 1, pp. 310–319, Sep. 15, (1988).

Figure 5B:
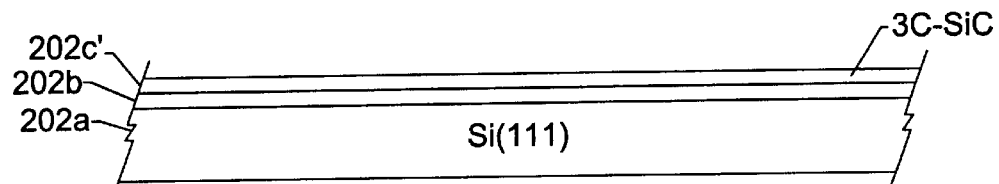
Figure 5C:
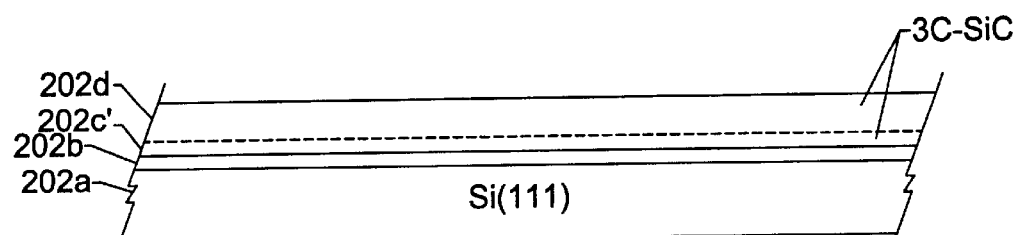
Figure 5D:
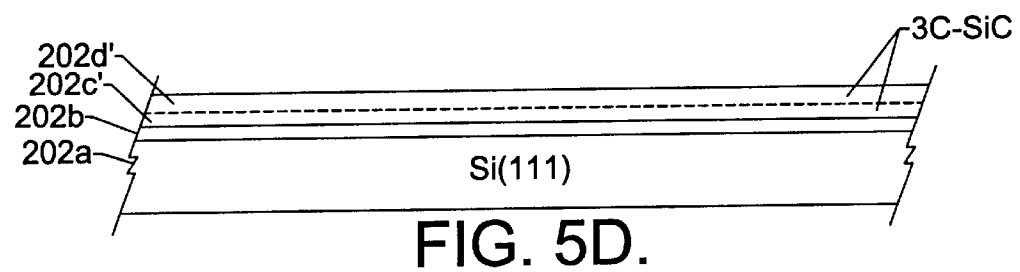
Figure 5E:
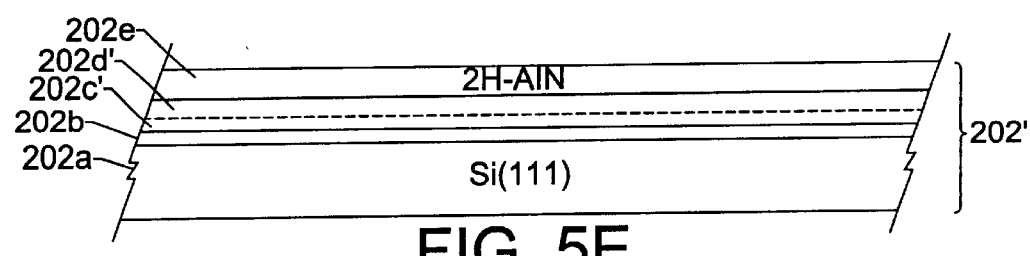
Figure 5F:
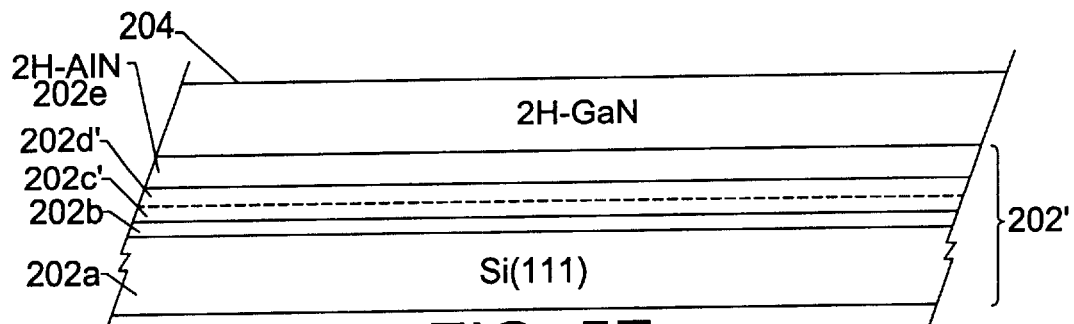

Then, referring to FIG. 5B, at least a portion of the (111) silicon surface layer 202c is preferably converted to 3C-silicon carbide. As illustrated by FIG. 5C, a layer of 3C-silicon carbide 202d is then epitaxially grown on the converted (111) silicon surface layer 202c'. As shown in FIG. 5D, the epitaxially grown layer of 3C-silicon carbide 202d optionally is thinned to produce a thinned epitaxial layer of 3C-silicon carbide 202d'. A 2H-aluminum nitride layer and/or gallium nitride buffer layer 202e then is grown on the thinned epitaxially grown layer of 3C-silicon carbide 202d, as illustrated by FIG. 5E. Then, as shown by FIG. 5F, an underlying layer of 2H-gallium nitride 204 is grown on the buffer layer 202e using, for example, a heteroepitaxial growth technique.

Figure 5G:
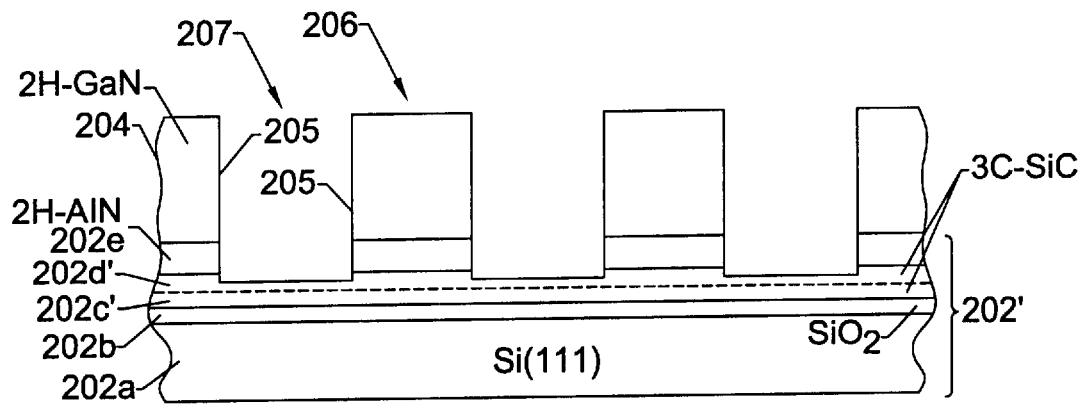
Figure 5H:
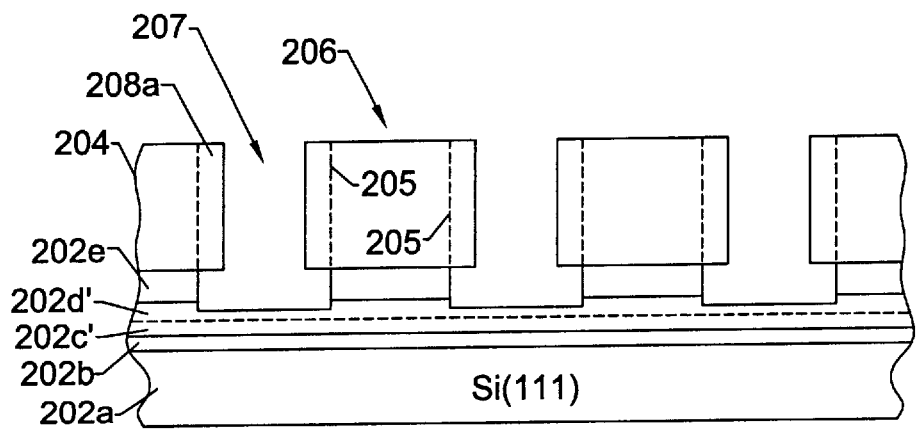
Figure 5I:
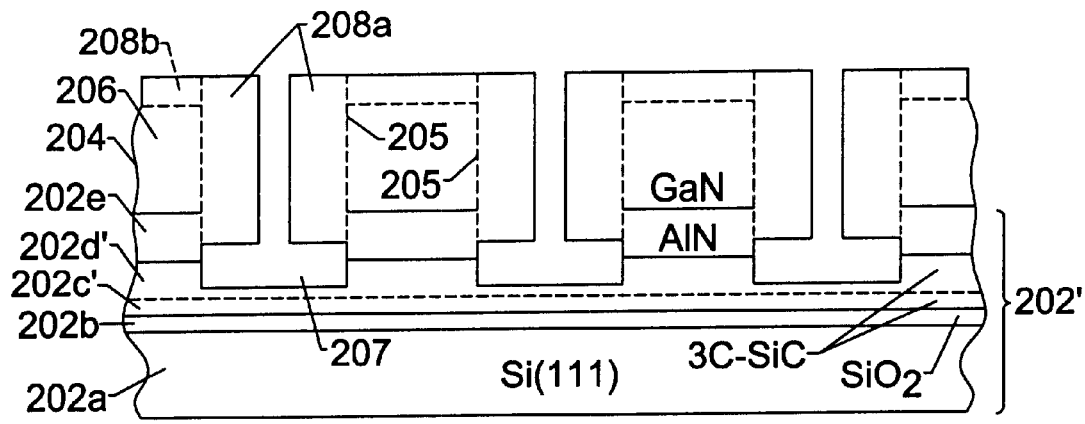

FIGS. 5G–5I now will show the use of pendeoepitaxy to laterally grow the underlying seed layer of 2H-gallium nitride 204 into a monocrystalline gallium nitride semiconductor layer. As described in the aforementioned U.S. application Ser. No. 09/441,754, pendeoepitaxial techniques may be used advantageously to grow a monocrystalline gallium nitride semiconductor layer having an average defect density level therein of less than about $10^5$ $cm^{-3}$. Referring to FIG. 5G, the underlying gallium nitride layer 204 may be formed to have a plurality of sidewalls 205 therein. It will be understood by those having skill in the art that the sidewalls 205 may be thought of as being defined by a plurality of spaced apart posts 206, that also may be referred to as "mesas", "pedestals" or "columns". The sidewalls 205 also may be thought of as being defined by a plurality of trenches 207, also referred to as "wells" in the underlying gallium nitride layer 204. The sidewalls 205 may also be thought of as being defined by a series of alternating trenches 207 and posts 206. It will be understood that the posts 206 and the trenches 207 that define the sidewalls 205 may be fabricated by selective etching, selective epitaxial growth and/or other conventional techniques. Moreover, it also will be understood that the sidewalls need not be orthogonal to the substrate 202, but rather may be oblique thereto. Finally, it also will be understood that although the sidewalls 205 are shown in cross-section in FIG. 5G, the posts 206 and trenches 207 may define elongated regions that are straight, V-shaped or have other shapes. The trenches 207 may also extend into the buffer layer 202e and into the underlying silicon carbide layer 202c'/202d', so that subsequent gallium nitride growth occurs preferentially on the sidewalls 205 rather than on the trench floors. In other embodiments, the trenches may not extend into the silicon carbide layer 202c'/202d', and also may not extend into buffer layer 202e, depending, for example, on the trench geometry and the lateral versus vertical growth rates of the gallium nitride seed layer.

Referring now to FIG. 5H, the sidewalls 205 of the underlying gallium nitride layer 204 are laterally grown to form a lateral gallium nitride layer 208a in the trenches 207. Lateral growth of gallium nitride may be obtained at 1000–1100° C. and 45 Torr. The precursors TEG at 13–39 pmol/min and $NH_3$ at 1500 sccm may be used in combination with a 3000 sccm $H_2$ diluent. If gallium nitride alloys are formed, additional 15 conventional precursors of aluminum or indium, for example, may also be used. As used herein, the term "lateral" means a direction that is orthogonal to the sidewalls 205. It will also be understood that some vertical growth on the posts 206 may also take place during the lateral growth from sidewalls 205. As used herein, the term "vertical" denotes a directional parallel to the sidewalls 205.

Figure 5J:
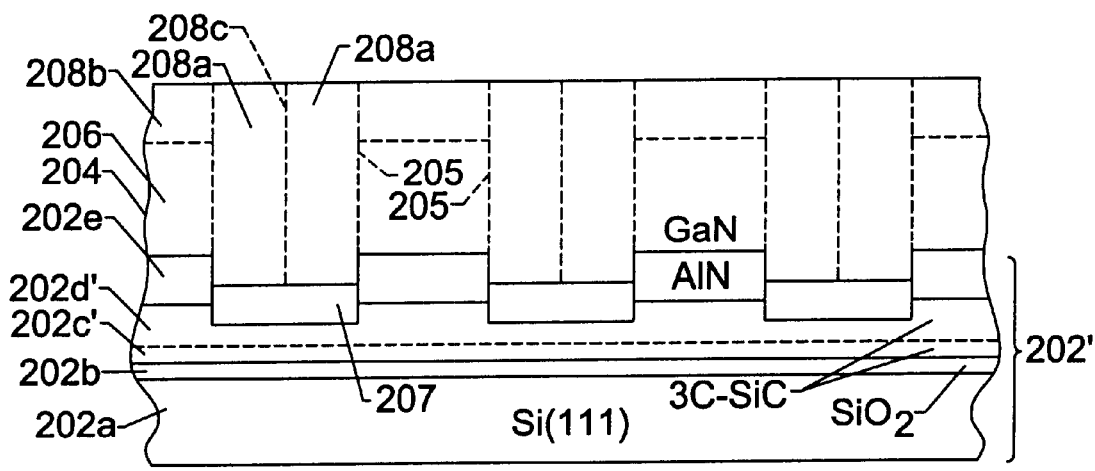

Referring now to FIG. 5I, continued growth of the lateral gallium nitride layer 208a causes vertical growth onto the underlying gallium nitride layer 204, specifically onto the posts 206, to form a vertical gallium nitride layer 208b. Growth conditions for vertical growth may be maintained as was described in connection with FIG. 5H. As also shown in FIG. 5I, continued vertical growth into trenches 207 may take place at the bottom of the trenches. Referring now to FIG. 5J, growth is allowed to continue until the lateral growth fronts coalesce in the trenches 207 at the interfaces 208c, to form a continuous gallium nitride semiconductor layer in the trenches. The total growth time may be approximately 60 minutes. As illustrated by FIG. 4, each of the steps described above with respect to FIGS. 5A–5J may be performed simultaneously with respect to each of the selective growth regions 12 so that a plurality of compound semiconductor substrates 20 can be formed at spaced locations across a substrate 10.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor substrate, comprising the steps of:

forming a plurality of selective growth regions at spaced locations on a first substrate by forming each selective growth region as a respective plurality of trenches on the first substrate, wherein each selective growth region is separated from at least one adjacent growth region by at least one wide trench at least ten times as wide as at least one of the respective plurality of trenches;

forming a plurality of semiconductor layers at spaced locations on the first substrate by pendeoepitaxially growing a respective, compound gallium nitride semiconductor layer on each of the selective growth regions; and dividing the first substrate into a plurality of second smaller substrates that contain only a respective one of the plurality of semiconductor layers, by partitioning the first substrate at the at least one wide trench between the selective growth regions.

2. A method of forming a semiconductor substrate, comprising the steps of:

forming a plurality of selective growth regions at spaced locations on a first substrate by forming each growth region as a respective plurality of trenches in the first substrate, wherein each selective growth region is separated from at least one adjacent growth region by at least one wide trench at least ten times as wide as at least one of the respective plurality of trenches;

forming a plurality of semiconductor layers at spaced locations on the first substrate by growing a respective semiconductor layer on each of the selective growth regions; and dividing the first substrate into a plurality of second smaller substrates that contain only a respective one of the plurality of semiconductor layers, by partitioning the first substrate at the at least one wide trench between the selective growth regions.

3. The method of claim 2, wherein said step of forming a plurality of selective growth regions comprises:

forming a first selective growth region as a first plurality of trenches in the first substrate; and forming a second selective growth region as a second plurality of trenches in the first substrate.

* * * * *